United States Patent
Iketani

(10) Patent No.: US 12,548,695 B2
(45) Date of Patent: Feb. 10, 2026

(54) METHODS AND DEVICES FOR HIGH RESISTANCE AND LOW RESISTANCE CONDUCTOR LAYERS MITIGATING SKIN DEPTH LOSS

(71) Applicant: Averatek Corporation, Santa Clara, CA (US)

(72) Inventor: Shinichi Iketani, Sunnyvale, CA (US)

(73) Assignee: Averatek Corporation, Santa Clara, CA (US)

( * ) Notice: Subject to any disclaimer, the term of this patent is extended or adjusted under 35 U.S.C. 154(b) by 283 days.

(21) Appl. No.: 17/709,047

(22) Filed: Mar. 30, 2022

(65) Prior Publication Data

US 2022/0319741 A1   Oct. 6, 2022

Related U.S. Application Data

(60) Provisional application No. 63/167,929, filed on Mar. 30, 2021.

(51) Int. Cl.
| H01B 13/00 | (2006.01) |
| H01B 5/16 | (2006.01) |
| H10N 70/00 | (2023.01) |

(52) U.S. Cl.
CPC ........... *H01B 13/0026* (2013.01); *H01B 5/16* (2013.01); *H10N 70/021* (2023.02); *H10N 70/821* (2023.02)

(58) Field of Classification Search
CPC .... H01B 13/0026; H01B 5/16; H10N 70/021; H10N 70/821
See application file for complete search history.

(56) References Cited

U.S. PATENT DOCUMENTS

| 8,384,192 B2 * | 2/2013 | Zheng | H10D 1/692 |
| | | | 257/E29.342 |
| 8,822,814 B2 * | 9/2014 | Hayashi | H10F 77/211 |
| | | | 136/255 |

(Continued)

FOREIGN PATENT DOCUMENTS

| JP | 669289 | 3/1994 |
| JP | 200888541 | 4/2008 |

(Continued)

OTHER PUBLICATIONS

Broadbent et.al., "Experimental and analytical study of seed layer resistance for copper damascene electroplating", J. Vac. Sci. Technol. B 17, 2584-2595, 1999 (Year: 1999).*

(Continued)

*Primary Examiner* — Jeffrey T Carley
*Assistant Examiner* — Jose K Abraham
(74) *Attorney, Agent, or Firm* — Fish IP Law, LLP

(57) ABSTRACT

Methods and devices are contemplated incorporating both high resistance conductive materials (HRCM) and conductors. A HRCM is deposited on a conductor, such that the surface between the HRCM and the conductor is relatively smooth. A dielectric material is then deposited onto an exposed surface of the HRCM. The surface of the HRCM meeting the dielectric material is roughed or otherwise impressed such that it has a Ra of at least 5 μm. The ratio of resistivity between the HRCM and the conductor is at least 50:1 or 100:1, and the ratio of conductivity between the conductive material and the resistive material is at least 9:1, 19:1, or 99:1.

15 Claims, 4 Drawing Sheets

(56) References Cited

U.S. PATENT DOCUMENTS

| | | | |
|---|---|---|---|
| 9,425,046 B1 * | 8/2016 | Gee | H01L 21/3212 |
| 2003/0226687 A1 * | 12/2003 | Kataoka | H05K 3/067 |
| | | | 174/250 |
| 2005/0123816 A1 * | 6/2005 | Gao | H01M 8/0234 |
| | | | 429/480 |
| 2006/0219322 A1 * | 10/2006 | Fujino | H10N 60/0576 |
| | | | 148/96 |
| 2009/0284475 A1 * | 11/2009 | Nashiki | G06F 3/047 |
| | | | 345/173 |
| 2010/0096002 A1 * | 4/2010 | Hayashi | H01L 31/076 |
| | | | 427/75 |
| 2011/0088934 A1 * | 4/2011 | Kano | C23C 18/1608 |
| | | | 174/257 |
| 2011/0308848 A1 | 12/2011 | Ito | |
| 2012/0161192 A1 * | 6/2012 | Kim | H01B 1/04 |
| | | | 428/688 |
| 2016/0064836 A1 * | 3/2016 | Nishikawa | H01R 3/08 |
| | | | 174/68.2 |
| 2017/0303405 A1 | 10/2017 | Fukuchi | |
| 2018/0160526 A1 | 6/2018 | Becker | |
| 2019/0229323 A1 * | 7/2019 | Mikhaylik | H01M 10/052 |
| 2019/0270857 A1 * | 9/2019 | Wu | C09D 4/06 |
| 2021/0305464 A1 * | 9/2021 | Herner | H01L 27/15 |
| 2022/0061147 A1 * | 2/2022 | Kim | H05K 1/0242 |
| 2022/0407069 A1 * | 12/2022 | Ogi | H01M 4/133 |

FOREIGN PATENT DOCUMENTS

| | | | |
|---|---|---|---|
| KR | 20150001087 A | * | 1/2015 |
| KR | 20200073051 | | 6/2020 |

OTHER PUBLICATIONS

Table of Electrical Resistivity and Conductivity. Accessed on Sep. 18, 2024, 3:47 PM. (Year: 2024).*

* cited by examiner

METHODS AND DEVICES FOR HIGH RESISTANCE AND LOW RESISTANCE CONDUCTOR LAYERS MITIGATING SKIN DEPTH LOSS

This application claims priority to U.S. Provisional Patent Application No. 63/167,929, filed Mar. 30, 2021, which is incorporated in its entirety herein.

FIELD OF THE INVENTION

The field of the invention relates to methods and systems for manufacturing conductive layers.

BACKGROUND

The following description includes information that may be useful in understanding the present invention. It is not an admission that any of the information provided herein is prior art or relevant to the presently claimed invention, or that any publication specifically or implicitly referenced is prior art.

All publications identified herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

There is a need for improved methods, systems, and devices to reduce skin depth loss of conductors in circuits.

SUMMARY OF THE INVENTION

The inventive subject matter provides systems, methods, and devices related to mitigating skin depth loss of conductors in circuits. A material that is resistive and conductive (e.g., high resistance conductive material (HRCM)) is disposed on the surface of a substrate, for example a dielectric. A conductive material is disposed on a surface of the HRCM, typically in the pattern of a circuit or portion thereof. The conductive material is less resistive (preferably much less resistive), and more conductive (preferably much more conductive), than the resistive material. For example, the ratio of resistivity between the HRCM and the conductive material is typically more than 50:1 or 100:1 (e.g., HRCM is much more resistive than the conductive material). Viewed from another perspective, the ratio of conductivity between the conductive material and the HRCM is at least 9:1, 19:1, or 99:1 (e.g., conductive material is much more conductive than the HRCM). Contemplated resistive materials (e.g., HRCM) include at least one of a metal (e.g., bismuth, tin, lead), alloys therefrom, a conductive organic material (e.g., epoxy with nano metal (silver, copper) particles), or combinations therefrom.

The surface of the substrate meeting the resistive material is typically rougher than the surface of the resistive material meeting the conductive material. For example, the surface of the substrate (and by extension the surface of the resistive material meeting the substrate) has an arithmetic average roughness (Ra) of at least 1 µm or 5 µm. The Ra of the surface of the resistive material meeting the conductive material (and thus the surface of the conductive material) is at least less than of the Ra of the surface of the substrate meeting the resistive material, and typically less than half or a quarter thereof. The Ra of the surface of the resistive material is less than 2.5 µm, preferably less than 1 µm, 0.5 µm, 0.1 µm, or 0.01 µm.

In some embodiments the resistive material includes a first material disposed on the surface of the substrate and a second material disposed on the first material, such that the ratio of resistivity between the second and first material is at least 50:1 or 100:1. The first material is typically conductive (e.g., copper) and no more than 2 µm, 1 µm, or 0.5 µm thick.

Methods of forming conductive layers are further contemplated. A resistive material (e.g., HRCM, conductive, etc.) is deposited on a surface of a substrate. A conductive material is further deposited on a surface of the resistive material, and typically forms a portion of a circuit. The resistive material is typically much less conductive than the conductive material, for example with ratio of conductivity between the conductive and resistive material at least 9:1, 19:1, or 99:1. Viewed from another perspective, the ratio of resistivity between the resistive material and the conductive material is typically more than 50:1 or 100:1. The Ra of the surface of the resistive material (surface meeting the conductive material) is at least half the Ra of the surface of the substrate (surface meeting the resistive material).

In some embodiments, depositing the resistive material on the substrate includes one of CVD (Chemical Vapor Deposition) or PVD (Physical Vapor Deposition) of the resistive material to the substrate, or depositing a catalyst to the surface of the substrate and depositing the resistive material to the catalyst. Depositing the catalyst to the substrate can likewise include depositing the catalyst by CVD or PVD, or coating the substrate with a catalyst precursor (e.g., solvent carrying the catalyst precursor) and subsequently activating the catalyst precursor. Depositing the resistive material to the substrate also includes depositing a conductor to the substrate (e.g., no more than 2 µm, 1 µm, or 0.5 µm thick; e.g. via CVD, PVD, electroless deposition to catalyst, etc.) and depositing the resistive material to the conductor, for example by electrolytic deposition.

Methods of forming circuits are further contemplated. A resistive material is deposited on a surface of a conductive layer. The resistive material is conductive, but much less conductive than the conductive layer. The Ra of the surface of the conductive layer is no more than half the Ra of an exposed surface of the resistive material, or of a surface of a substrate. The exposed surface of the resistive material is laminated to the substrate. Portions of the conductive layer are removed to form the circuit or a portion thereof. Depositing the resistive material to the conductive layer typically includes CVD, PVD, or electrolytic deposition.

Various objects, features, aspects and advantages of the inventive subject matter will become more apparent from the following detailed description of preferred embodiments, along with the accompanying drawing figures in which like numerals represent like components.

DETAILED DESCRIPTION

The inventive subject matter provides systems, methods, and devices related to mitigating skin depth loss of conductors in circuits.

Figure 1:
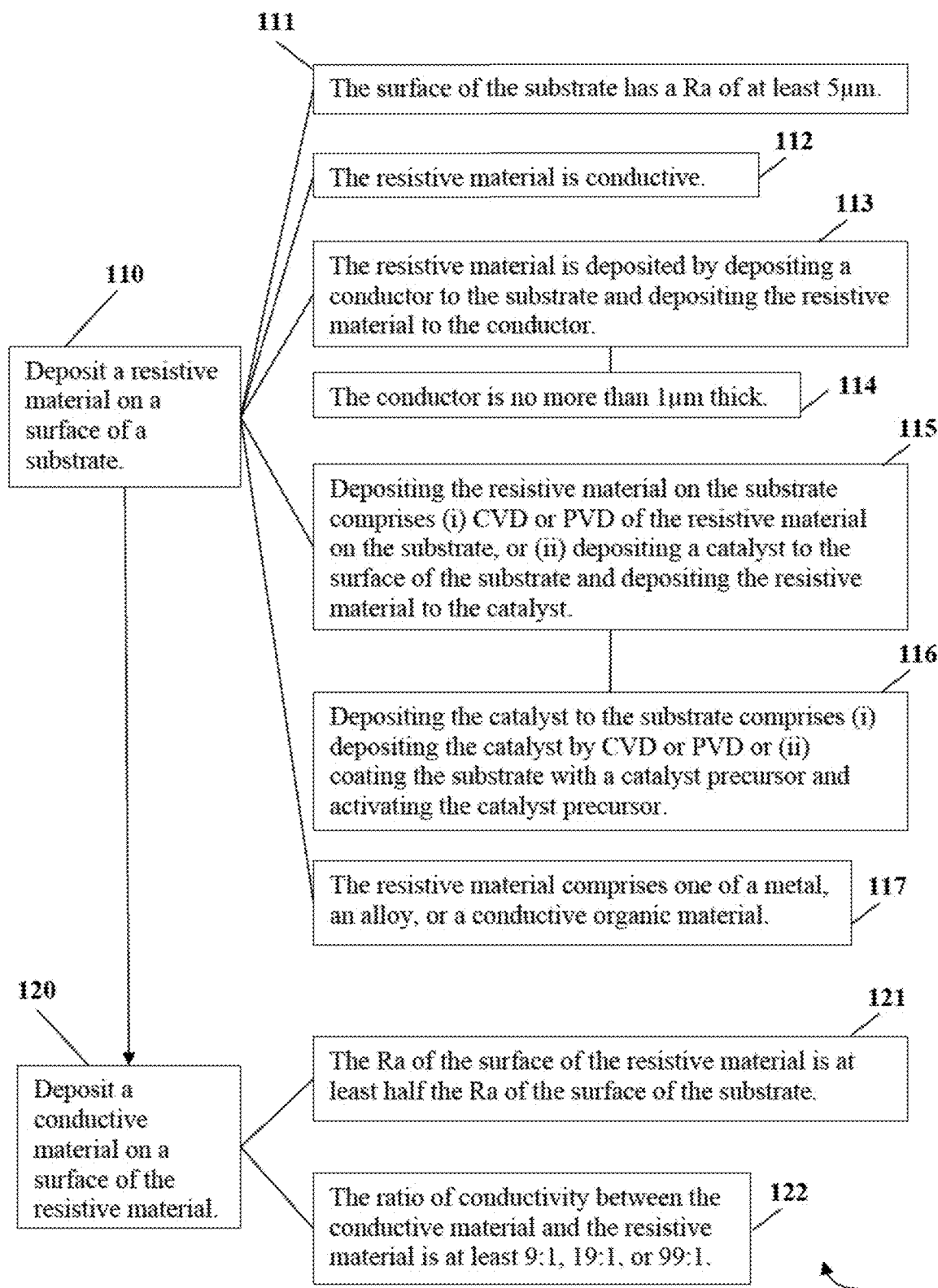
FIG. 1 depicts a flow chart for forming conductive layers.

FIG. 1 depicts a flow chart 100 for forming conductive layers. Flow chart 100 includes steps 110 and 120, as well as optional steps 111 to 117 relating to step 110 and optional steps 121 and 122 relating to step 120.

Figure 2:
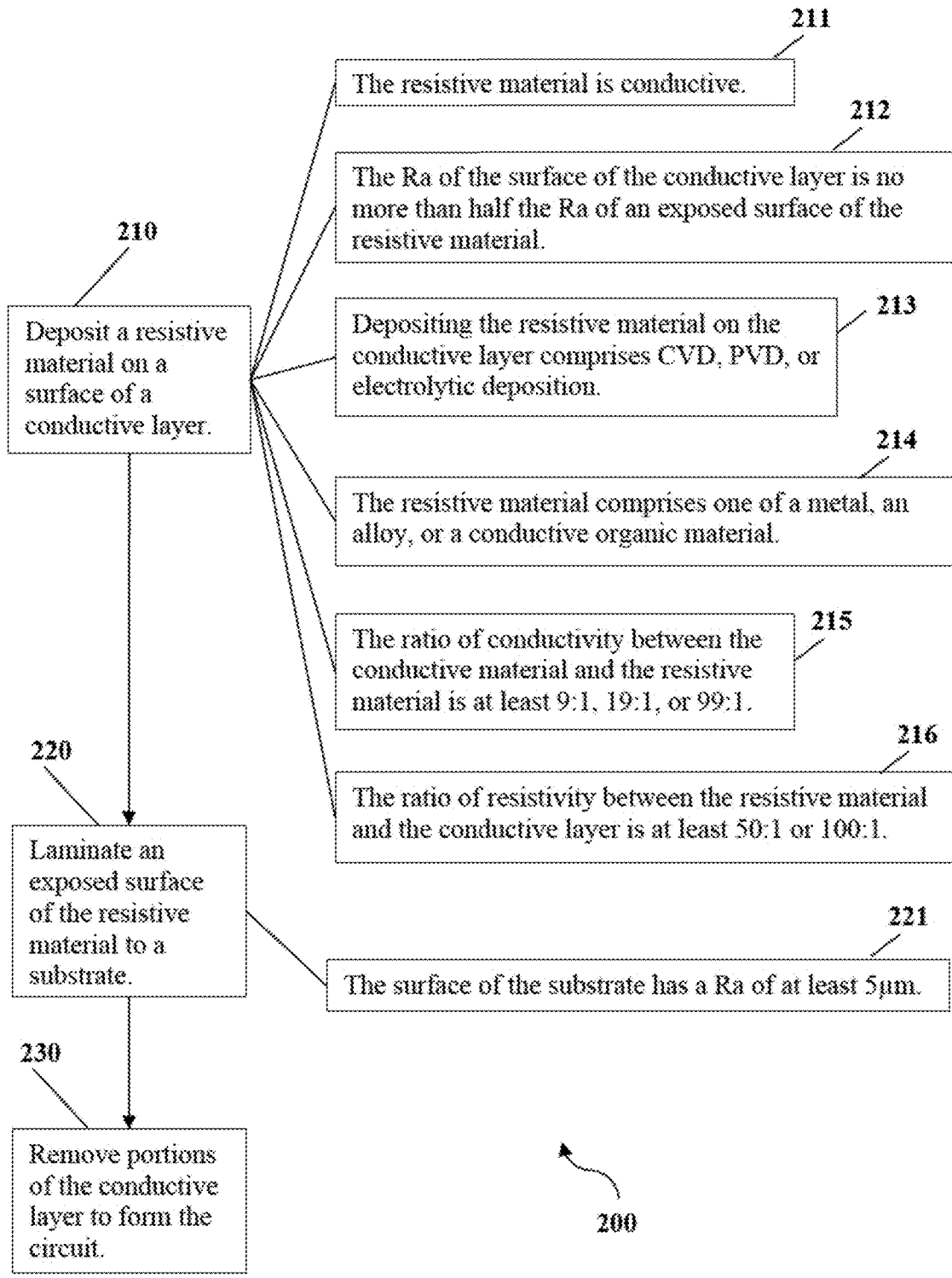
FIG. 2 depicts another flow chart for forming a circuit.

FIG. 2 depicts a flow chart 200 for forming a circuit. Flow chart 200 includes steps 210, 220, and 230, as well as optional steps 211 to 216 relating to step 210 and optional step 221 relating to step 220.

Figure 3:
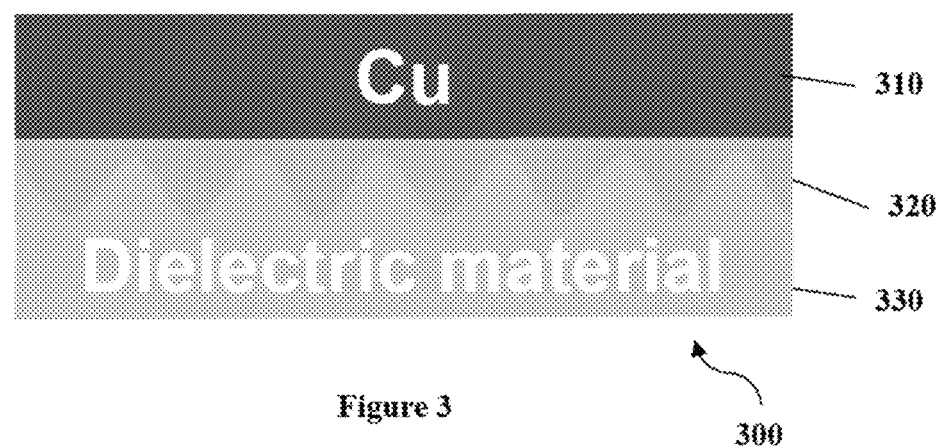
FIG. 3 depicts an electrical circuit of the inventive subject matter.

FIG. 3 depicts a circuit having conductor 310 (e.g., copper) layered on high resistant conductive material (HRCM) 320 deposited on dielectric substrate 330. Conductor 310 is less resistive, and more conductive, than HRCM 320. For example, the ratio of resistivity between HRCM 320 and conductor 310 is typically more than 50:1 or 100:1. Likewise, the ratio of conductivity between 310 conductor and HRCM 320 is at least 9:1, 19:1, or 99:1. Contemplated resistive materials (e.g., HRCM 320) include at least one of a metal (e.g., bismuth, tin, lead), alloys therefrom, a conductive organic material (e.g., epoxy with nano metal (copper silver) particle), or combinations therefrom.

The surface of substrate 330 meeting 320 HRCM is typically rougher than the surface of HRCM 320 meeting conductor 310. For example, the surface of substrate 330 (and by extension the surface of HRCM 320 meeting the substrate) has a Ra of at least 1 µm or 5 µm. The Ra of the surface of HRCM 320 meeting conductor 310 (and thus the surface of conductor 310) is at least less than the Ra of the surface of the substrate meeting the HRCM, though typically less than half or a quarter or 10%. The Ra of the surface of HRCM 320 is less than 2.5 µm, preferably less than 1 µm, 0.5 µm, 0.1 µm, or 0.01 µm.

Figure 4:
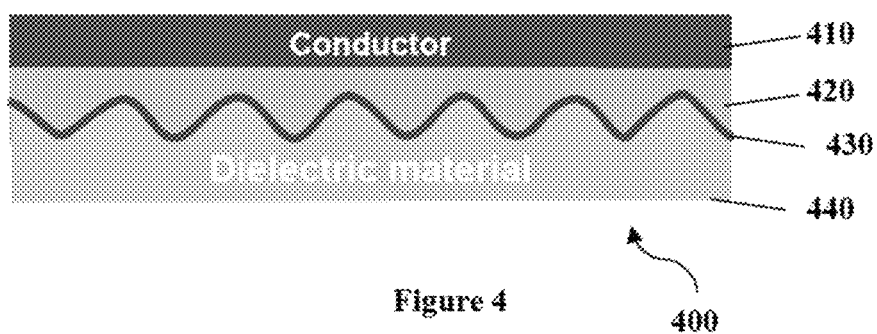
FIG. 4 depicts another electrical circuit of the inventive subject matter.

FIG. 4 depicts circuit 400 having conductor 410 (e.g., copper) layered on a high resistant conductive material (HRCM) 420 deposited on conductor 430 along the surface of dielectric substrate 440. In this embodiment, the resistive material 420 can be viewed as having a first material disposed on the surface of the substrate (e.g., conductor 410) and a second material disposed on the first material (e.g., HRCM 420), such that the ratio of resistivity between the second and first material is at least 50:1 or 100:1. The first material is typically conductive (e.g., copper) and no more than 20 µm, 10 µm, or 5 µm thick. Conductor 430 is preferably deposited as a thin layer, for example less than 2 µm, 1 µm, 0.5 µm, or 0.1 µm thick, and is typically copper. In some embodiments, the thickness of conductor 430 is less than half, or less than a quarter, of the Ra of the surface of dielectric 440 in contact with conductor 430 (or the surface of HRCM 420 in contact with conductor 430).

Figure 5:
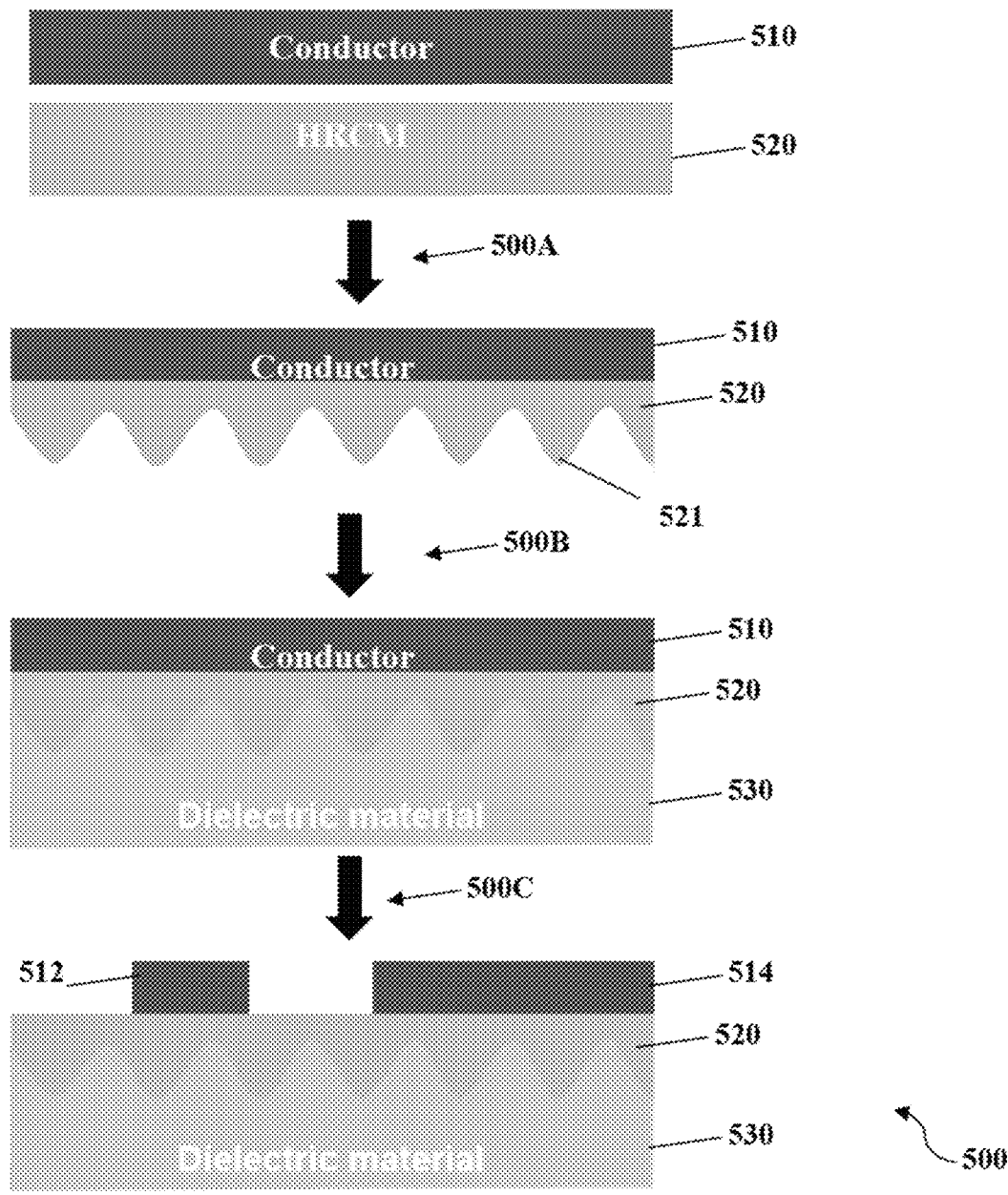
FIG. 5 depicts yet another electrical circuit of the inventive subject matter.

FIG. 5 depicts flow chart 500 for forming a circuit. In step 500A. HRCM 520 is deposited on the surface of conductive layer 510 (e.g., copper). HRCM 520 is conductive, though its conductivity is much less than that of conductor layer 510, and its resistivity is much higher than conductive layer 510. In some embodiments, an exposed surface of HRCM 520 is roughened (see surface 521)(for example, after or during step 500A) or otherwise has a Ra at least more than twice the Ra of the surface of conductor layer 510 meeting HRCM 520.

In step 500B, the combined conductor 510 and HRCM 520 construct is laminated to substrate 530 (e.g., dielectric material), as depicted. In some embodiments, the roughened surface 521 of HRCM 520 (e.g., Ra at least twice Ra of surface of conductor layer, I.) is impressed on a surface of substrate 530. However, it is also contemplated the surface of substrate 530 has an Ra at least twice the Ra of the surface of conductor layer 510 meeting HRCM 520 (e.g., surface 521). In either event, the meeting surface between HRCM 520 and substrate 530 has an Ra at least twice the Ra of the meeting surface between HRCM 520 and conductor layer 510.

In step 500C, one or more portions of conductor layer 510 are removed (or additional portions of conductor are added, or combinations thereof) to form conductive pattern of a circuit comprising conductor portions 512 and 514.

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

In some embodiments, the numbers expressing quantities of ingredients, properties such as concentration, reaction conditions, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

Unless the context dictates the contrary, all ranges set forth herein should be interpreted as being inclusive of their endpoints, and open-ended ranges should be interpreted to include only commercially practical values. Similarly, all lists of values should be considered as inclusive of intermediate values unless the context indicates the contrary.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . . And N, the text should be interpreted as requiring only one element from the group, not A plus N, or B plus N, I.

What is claimed is:

1. A method of forming conductive layers, comprising:
   depositing a resistive material on a surface of a substrate, wherein the resistive material is conductive, and
   depositing a conductive material on a surface of the resistive material, wherein an arithmetic average roughness (Ra) of the surface of the resistive material in contact with the conductive material is at least half an Ra of the surface of the substrate in contact with the resistive material;
   wherein the step of depositing the resistive material on the substrate comprises first depositing a conductive layer to the substrate followed by depositing the resistive material to the conductive layer, such that the conductive layer is between the substrate and the resistive material.

2. The method of claim 1, wherein the conductive material forms a portion of a circuit.

3. The method of claim 1, wherein the step of depositing the resistive material on the substrate comprises (i) CVD (Chemical Vapor Deposition) or PVD (Physical Vapor Deposition) of the resistive material on the substrate, or (ii) depositing a catalyst to the surface of the substrate and depositing the resistive material to the catalyst.

4. The method of claim 3, wherein the step of depositing the catalyst to the substrate comprises (i) depositing the catalyst by CVD or PVD or (ii) coating the substrate with a catalyst precursor and activating the catalyst precursor.

5. The method of claim 1, wherein the conductor is no more than 1 µm thick.

6. A method of forming conductive layers, comprising:
   depositing a resistive material on a surface of a substrate, wherein the resistive material is conductive, and
   depositing a conductive material on a surface of the resistive material, wherein an arithmetic average roughness (Ra) of the surface of the resistive material in contact with the conductive material is at least half an Ra of the surface of the substrate in contact with the resistive material;
   wherein a ratio of conductivity between the conductive material and the resistive material is at least 9:1, 19:1, or 99:1.

7. The method of claim 1, wherein the step of depositing the conductive material on the resistive material comprises electrolytic deposition.

8. A method of forming conductive layers, comprising:
   depositing a resistive material on a surface of a substrate, wherein the resistive material is conductive, and
   depositing a conductive material on a surface of the resistive material, wherein an arithmetic average roughness (Ra) of the surface of the resistive material in contact with the conductive material is at least half an Ra of the surface of the substrate in contact with the resistive material;
   wherein a ratio of resistivity between the resistive material and the conductive layer is at least 50:1 or 100:1.

9. The method of claim 1, wherein the surface of the substrate has an arithmetic average roughness (Ra) of at least 5 µm.

10. The method of claim 1, wherein the Ra of the surface of the resistive material in contact with the conductive material is at least less than, or less than half, the Ra of the surface of the substrate.

11. The method of claim 1, wherein the Ra of the surface of the resistive material in contact with the conductive material is less than 2.5 µm, 1 µm, or 0.1 µm.

12. The method of claim 1, wherein the resistive material comprises one of a metal, an alloy, or a conductive organic material.

13. The method of claim 1, wherein the resistive material comprises a first material disposed on the surface of the substrate and a second material disposed on the first material, wherein the first material is a conductor and the second material is a high resistance conductive material, and wherein the ratio of resistivity between the second material and the first material is at least 50:1 or 100:1.

14. The method of claim 13, wherein the first material is no more than 1 µm thick.

15. The method of claim 1, wherein the step of depositing the conductive material on the surface of the resistive material precedes the step of depositing the resistive material on the surface of the substrate, and wherein the step of depositing the resistive material to the surface of the substrate comprises laminating an exposed surface of the resistive material to the substrate.

* * * * *